United States Patent
Einerhand et al.

[11] Patent Number: 6,034,509
[45] Date of Patent: Mar. 7, 2000

[54] BATTERY-POWERED ELECTRICAL DEVICE WITH IMPROVED CALCULATION OF DISCHARGE TERMINATION

[75] Inventors: Robert E. F. Einerhand; Johann R. G. C. Van Beek, both of Eindhoven, Netherlands; Jean N. Patillon, Paris, France

[73] Assignee: U.S. Philips Corporation, New York, N.Y.

[21] Appl. No.: 09/085,080

[22] Filed: May 26, 1998

[30] Foreign Application Priority Data

May 27, 1997 [EP] European Pat. Off. .............. 97401161

[51] Int. Cl.[7] ........................................................ H02J 7/04

[52] U.S. Cl. ............................................ 320/148; 320/137

[58] Field of Search ..................................... 320/148, 136, 320/137; 429/97, 141, 142

[56] References Cited

U.S. PATENT DOCUMENTS

| | | | |
|---|---|---|---|
| 5,278,509 | 1/1994 | Haynes et al. | 320/134 |
| 5,394,089 | 2/1995 | Clegg | 320/DIG. 21 |

*Primary Examiner*—Peter S. Wong
*Assistant Examiner*—Lawrence Luk
*Attorney, Agent, or Firm*—Steven R. Biren

[57] ABSTRACT

A battery-powered electrical device comprising a switchable voltage drain (3,5) and a rechargeable battery (1), and further comprising means for measuring the voltage V across the terminals of the battery (1) as a function of cumulative discharge time t, and for determining the cumulative discharge time $t_p$ corresponding to the attainment of the local extremum of least magnitude in the derivative dV/dt. In a particular embodiment, the device contains means for interrupting the voltage drain (3,5) upon expiry of a cumulative discharge time $t_e=nt_p$, whereby n is a fixed, pre-selected real number. In addition, it is possible to calculate and display the remaining discharge time $t_{rem}=m_o t_o-t$, where $m_o$ is a fixed, pre-selected real number. The values of n and $m_o$ will generally be chosen to lie in the range 1.2–6.

10 Claims, 3 Drawing Sheets

BATTERY-POWERED ELECTRICAL DEVICE WITH IMPROVED CALCULATION OF DISCHARGE TERMINATION

BACKGROUND OF THE INVENTION

The invention relates to a battery-powered electrical device comprising a switchable voltage drain and a rechargeable battery. The term "battery" should here be broadly interpreted as encompassing a single cell as well as arrays of such cells (i.e. battery packs).

Devices of this type are well known from everyday experience, and include, for example, electric power tools, video cameras, mini vacuum cleaners, lap-top computers, electronic notebooks, portable music sources, torches, shavers, etc. Many commonly-available battery-powered devices contain a voltage drain (e.g. a motor, lamp, electrical circuit, etc.) which simply continues to draw power from the battery until the battery voltage is no longer sufficient to operate the device; the operator is then expected to recharge the battery before further use. However, it is now generally known that such depletory usage can be detrimental to the performance of the battery in the long run, since discharge of battery cells beyond a certain point can cause the occurrence of irreversible chemical reactions within the cells, which can damage their performance. For this reason, it is generally desirable to interrupt power to the voltage drain well before the battery becomes depleted, and then to recharge the battery before further use.

There are various known ways in which to achieve this object. For example, in International Patent Application WO 96-35252, a resistive strain gauge is attached to an elastic surface in intimate contact with a wall of the battery. As the battery charge drops towards a certain threshold, the occurrence of the chemical reactions referred to in the previous paragraph causes an increase in the battery's internal pressure and/or temperature, resulting in slight expansion of the battery. Such expansion is detected by the strain gauge, which then interrupts the drain of power from the battery.

A disadvantage of the known method and device is that use of the strain gauge relies on the occurrence of chemical reactions which in themselves are a symptom that (slight) over-discharge of the battery has occurred. Thus, although the method prevents severe over-discharge of the battery, it does allow detrimental discharge to occur to some extent.

SUMMARY OF THE INVENTION

It is an object of the invention to provide an alternative to the known method and device.

This and other objects are achieved according to the invention in a device as specified in the opening paragraph, characterized in that the device comprises means for measuring the voltage V across the terminals of the battery as a function of cumulative discharge time t, and for determining the cumulative discharge time $t_p$ corresponding to the attainment of the local extremum of greatest magnitude in the derivative dV/dt.

A number of terms will now be defined in more detail:

The term "cumulative discharge time" should here be interpreted as referring to the sum of all successive periods of time during which current is drawn from the battery during a single discharge cycle, up to a given instant. Such a is discharge cycle starts at the instant that the battery is recharged (and is again allowed to be drained) and continues until the discharge is terminated. During any given cycle, discharge of the battery may occur in a single run, or in several runs separated by intervals during which no current is drawn from the battery;

The phrase "local extremum" refers to a local maximum or minimum in the functions ±dV/dt or ±dt/dV; it should hereby be noted that a local maximum in dV/dt corresponds to:
a local minimum in −dV/dt;
a local minimum in −dt/dV;
a local maximum in −dt/dV. Any reference to "dV/dt" throughout this text should be interpreted as in fact referring to ±dV/dt or ±dt/dV;

It is possible for more than one local extremum to be present in the characteristic of dV/dt. In such a case, the local extremum of greatest magnitude will be the highest peak in the case of a positive function and the lowest valley in the case of a negative function. The invention is particularly suited to application in apparatus in which the voltage drain draws a substantially constant current I during operation of the apparatus (meaning that I is constant within ±20% for the duration of a typical discharge cycle).

In experiments leading to the invention, the inventors monitored the behaviour of V as a function of t for various test batteries (including NiMH, NiCd and Li-ion batteries). By plotting the derivative $D=-dt/dV\ [=-(dV/dt)^{-1}]$ as a function of t, it was observed that D started out with a low value (zero), climbed toward and attained a maximum at $t=t_p$, and then declined again towards zero. Consistent with this behaviour, V started out with a relatively high value, fell monotonically onto a broad plateau, and then fell again more rapidly towards zero, starting with a characteristic "knee" at the end of the plateau. Surprisingly, it was found that, for any given test battery, there was a distinct relationship between $t_p$ and the value $t=t_o$ corresponding to the attainment of the battery's end-voltage $V_o$, viz. $t_o=m_o t_p$, in which $m_o$ is a constant for any given battery, and generally ranges between about 1.2 and 6, dependent on the type of battery and on its vendor. For the sake of clarity, the end-voltage $V_o$ is here defined to be 0.9 V in the case of NiCd and NiMH batteries (nominal voltage ≈1.2 V), and 3 V in the case of Li-ion batteries (nominal voltage ≈3.6 V).

The invention exploits the discovery elucidated in the previous paragraph by providing a device in which the occurrence of the said extremum, which is a local minimum of the absolute value of dV/dt, is monitored, and the cumulative discharge time $t_p$ at which it occurs is noted. This information can then be used in a number of ways, such as:

(1) In providing an automatic cut-off facility. In this case, discharge of the battery is automatically interrupted at a cumulative discharge time $t_c=nt_p$, where n is a preselected real number (which will generally be approximately equal to $m_o$);

(2) In determining (and displaying) the remaining running time of the device. In this case, knowing $t_p$ allows $t_o=m_o t_p$ to be calculated. Since the cumulative discharge time t is known at any instant, the remaining discharge time $t_{rem}=t_o-t$ can be calculated. If so desired, the value of t can be continuously displayed on the device (using a LCD display, for example).

In case (1), n will generally be chosen to be (approximately) equal to $m_o$, if automatic cut-off is to occur at $V_o$; however, n can be chosen to be smaller than $m_0$ if earlier cut-off is required. Values of n lower than about 0.85 $m_o$ will generally result in unnecessarily premature interruption of the discharge cycle, whereas values above about 1.05 $m_o$ will typically result in over-discharge of the battery.

Depending on particular circumstances, values of n outside these ranges may nevertheless be chosen, if so desired.

By way of example, the inventors have consistently observed the following (approximate) values of $m_o$ for the various batteries and vendors listed herebelow:

| type | vendor | $m_0$ |
|------|--------|-------|
| NiCd | A | 2.1 |
|      | B | 2.35 |
| NiMH | A | 2.5 |
| Li-ion | C | 1.55 |

Various specimens of the different battery types listed in the table were tested at a range of temperatures (0° C., 25° C., 45° C.) and at different discharge rates (1C, 0.33C, 0.1C, where αC is α× the electrical current necessary to drain the battery in one hour). The various vendors in the above table are:

A: Golden Peak Industries, Honk Kong;

B: Saft, France;

C: Matsushita Battery Industrial Corporation, Japan.

A particular embodiment of the device according to the invention is characterized in that $1.2 \leq n \leq 6$. All of the batteries tested by the inventors to date have had an $m_a$-value falling within this range.

BRIEF DESCRIPTION OF THE DRAWINGS

The invention and its attendant advantages will be further elucidated with the aid of exemplary embodiments and the accompanying schematic drawings, whereby.

DESCRIPTION OF THE PREFERRED EMBODIMENTS

Embodiment 1

Figure 1:
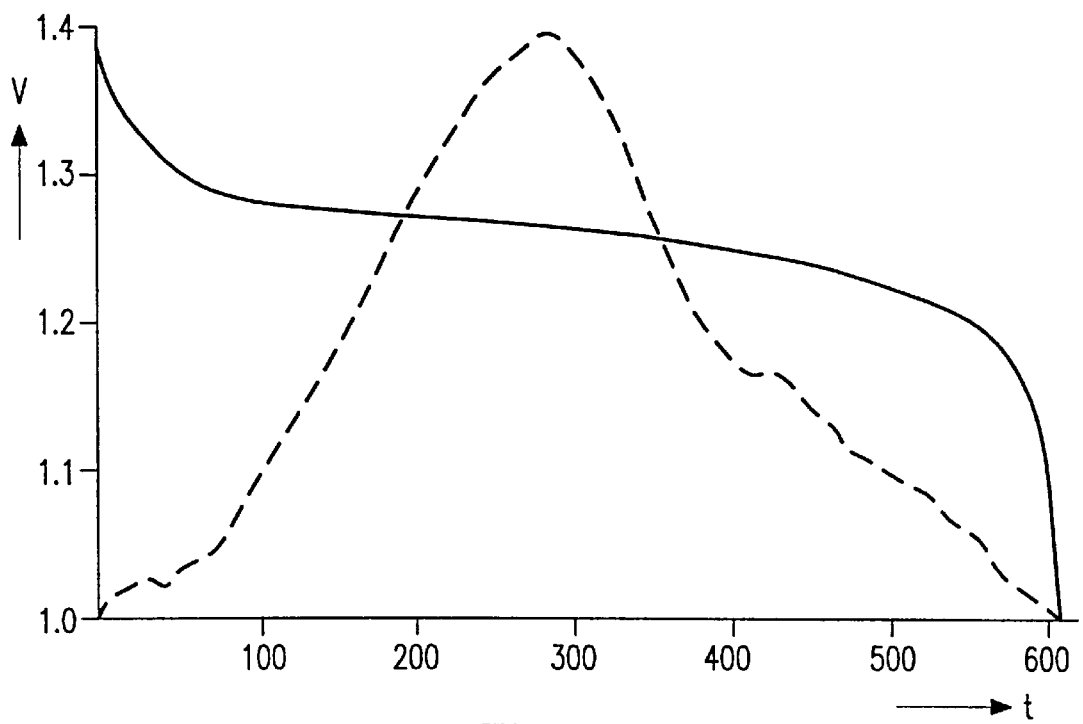
FIG. 1 graphically depicts the course of V and $D=-dt/dV$ as a function of t, for a NiCd battery.

FIG. 1 pertains to a NiCd battery (vendor A). The battery was discharged in a single run at a temperature of 25° C. and at a constant current rating of C/10 (i.e. one tenth of the electrical current necessary to drain the battery in one hour). The Figure shows a graph of voltage V (solid curve) and the derivative $D=-dt/dV$ (broken curve) as a function of cumulative discharge time t. The vertical axis (V only) is graduated in volts and the horizontal axis is graduated in minutes.

From the Figure, it is clear that D reaches a local maximum at $t=t_p \approx 285$ min., and that $V_o$ occurs at around $t=t_o \approx 605$ min. It therefore holds that $t_o=m_o t_p \approx 2.1 t_p$. A suitable value for n in this case is therefore 2.0, for example.

Embodiment 2

Figure 2:
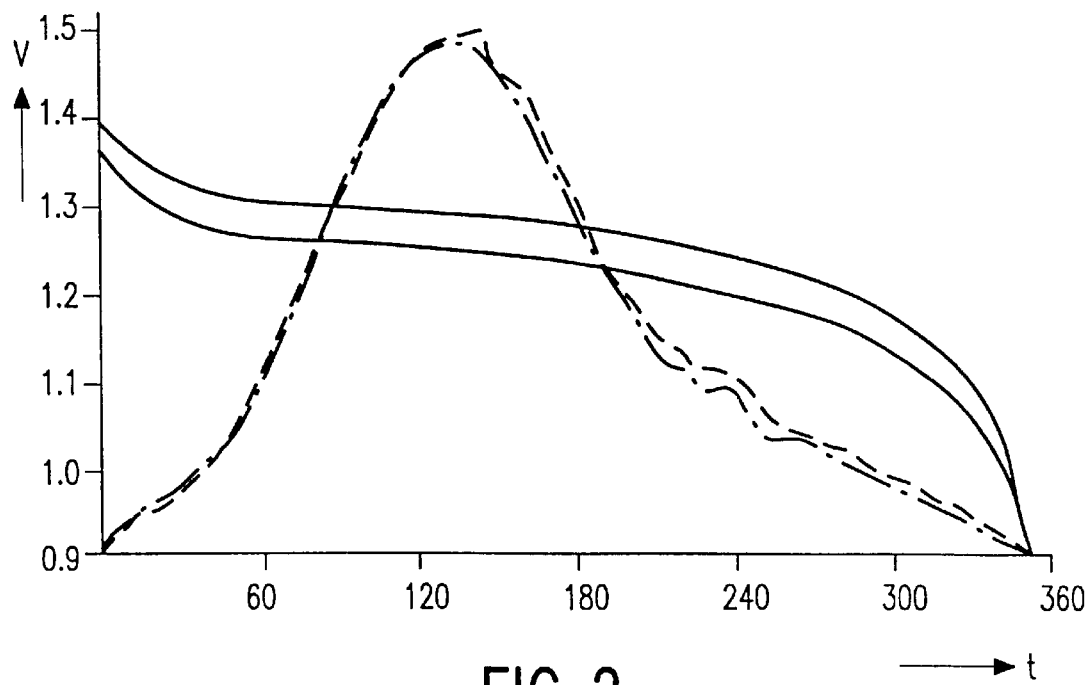
FIG. 2 is similar to FIG. 1, except in that it pertains to two NiMH batteries.

FIG. 2 pertains to a pair of NiMH batteries (both vendor A), and shows a graph of V (solid curve) and the derivative $D=-dt/dV$ (broken curve) as a function of t. The vertical axis (V only) is graduated in volts and the horizontal axis is graduated in minutes.

Although both batteries have a different V-characteristic, their D-characteristics are almost identical. From the Figure, it is clear that D reaches a local maximum at $t=t_p \approx 140$ min., and that $V_o$ occurs at around $t=t_o \approx 350$ min. It therefore holds that $t_o=m_o t_p \approx 2.5 t_p$. A suitable value for n in this case is therefore 2.4, for example.

Embodiment 3

Figure 3:
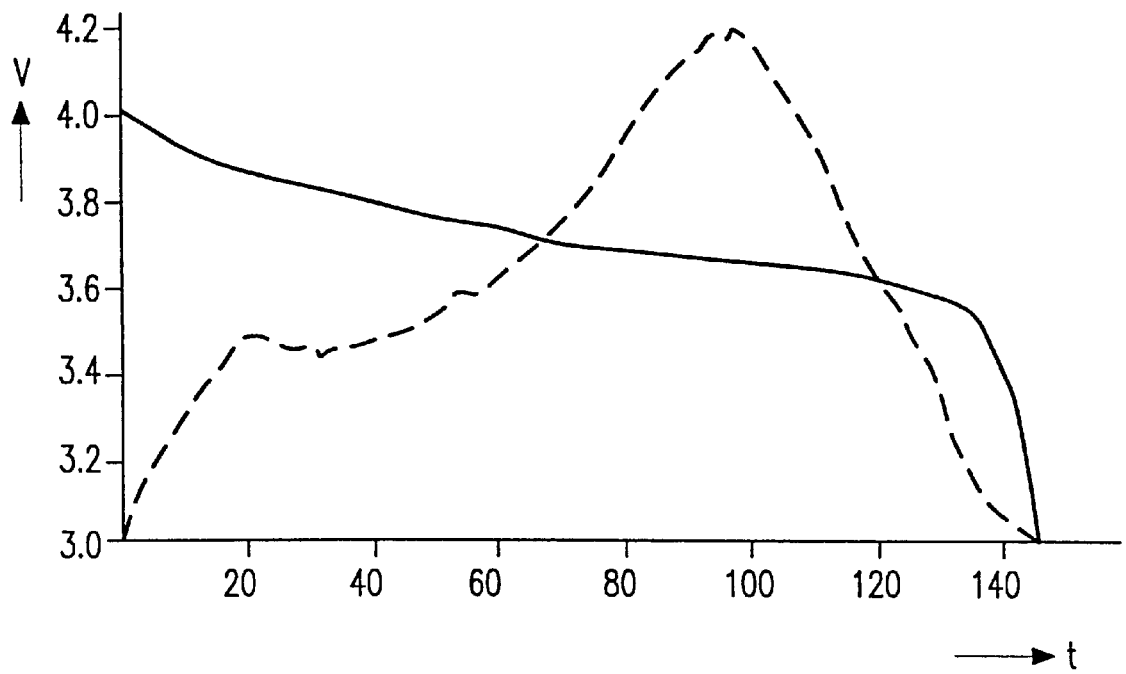
FIG. 3 is similar to FIG. 1, except in that it pertains to a Li-ion battery.

FIG. 3 pertains to a Li-ion battery, and shows a graph of V (solid curve) and the derivative $D=-dt/dV$ (broken curve) as a function of t. The vertical axis (V only) is graduated in volts and the horizontal axis is graduated in minutes.

From the Figure, it is clear that D reaches two local maxima, a minor (spurious) one at about $t=20$ min. and a principal (significant) one at about $t=95$ min; the value of $t_p$ is thus approx. 95 min. Furthermore, $V_o$ occurs at around $t=t_o \approx 145$ min. It therefore holds that $t_o=m_o t_p \approx 1.53 t_p$. A suitable value for n in this case is therefore 1.5, for example.

Embodiment 4

Figure 4:
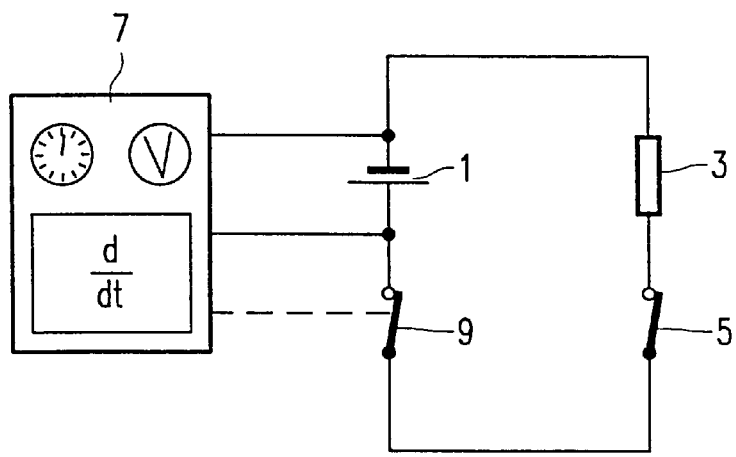
FIG. 4 depicts a particular embodiment of a device according to the invention.

FIG. 4 depicts a particular embodiment of a device according to the invention. This device comprises a rechargeable battery 1 which is connected to a voltage drain 3, such as a lamp or motor, for example. The voltage drain 3 is switchable via the switch 5. The device also comprises means 7 inter alia for measuring the voltage V across the battery 1, for measuring the cumulative discharge time t, for calculating the derivative dV/dt, and for determining the instant $t=t_p$ at which dV/dt reaches a local extremum. The means 7 also serve to interrupt the voltage drain from the battery 1, by opening the circuit breaker 9 at a time $t=t_e=nt_p$, where n is a fixed, pre-programmed real number.

Embodiment 5

Figure 5:
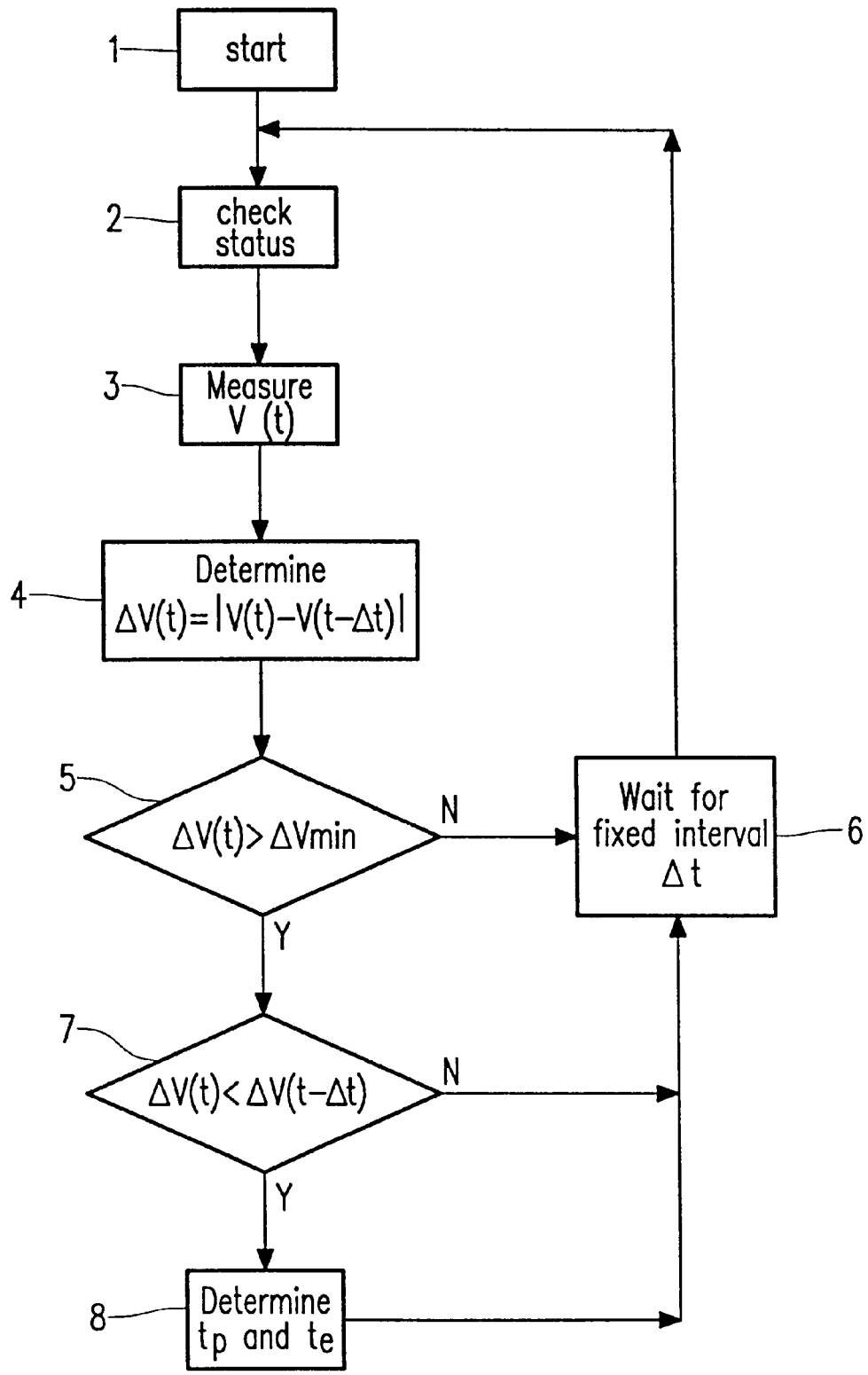
FIG. 5 depicts a flow chart which represents a possible algorithm for use in operating the device according to the invention.

FIG. 5 depicts a flow chart schematically representing a (simplified) algorithm which can be used in operating the device according to the invention (such as that discussed in Embodiment 4). Various steps in the flow chart will now receive further elucidation:

2 Memory means can be used to store data relating to, for example, the length of a sampling time interval $\Delta t$, the value of n, the previously measured voltage V, the change $\Delta V$ in V during the last interval $\Delta t$, the minimum (threshold) value $\Delta V_{min}$ of $\Delta V$ beyond which a significant extremum in dV/dt will be considered (as determined, for example, from pre-calibration with a test battery of the same sort), and the total elapsed discharge time $t=\Sigma \Delta t$;

5 Step 5 acts as a filter to ensure that spurious maxima in dV/dt (such as the low peak at $t=20$ in FIG. 3 or around $t=230$ in FIG. 2) are not used to determine $t_p$. Such peaks can be discarded by confirming that they occur below the pre-programmed threshold value $\Delta V_{min}$;

7 is the point at which the occurrence of a significant peak in $\Delta V/\Delta t$ is identified, from which peak tp can be determined;

8 $t_p$ is the value of t at the occurrence of the peak identified in step 7, and $t_e=nt_p$.

Once $t=t_e$, the algorithm can be interrupted and the drain of voltage from the battery stopped.

Embodiment 6

In a situation similar to that set forth in Embodiment 5, an additional step in the flow chart calculates the remaining discharge time $t_{rem}=m_o t_p-t$ at any given instant, where $m_o$ is a pre-selected real number which is stored in a memory (see point 2 of Embodiment 5). If so desired, the value of $t_{rem}$ can be continually displayed using display means. Alternatively, an alarm signal can be generated as soon as $t_{rem}$ reaches a lower threshold value (e.g. 10% of $m_o t_p$).

What is claimed is:

1. A battery-powered electrical device comprising a switchable voltage drain, a rechargeable battery, means for measuring the voltage V across the terminals of the battery as a function of cumulative discharge time t, and means for determining a derivative dV/dt of the change of voltage with respect to cumulative discharge time, characterized in that the device comprises means for determining a value of time $t_p$ corresponding to a local minimum of the absolute value of said derivative, and means responsive to said value of time for determining a further period of time that continuing discharge will be permitted.

2. A device as claimed in claim 1, characterized in that the device comprises means for interrupting said voltage drain upon expiry of a cumulative discharge time $t_c=nt_p$, where n is a fixed, pre-selected real number greater than 1.

3. A device as claimed in claim 2, characterized in that $1.2 \leq n \leq 6$.

4. A device as claimed in claim 3, characterized in that the type of battery is chosen from the group formed by NiCd, NiMH and Li-ion batteries.

5. A device as claimed in claim 1, comprising means for calculating a remaining discharge time $t_{rem}=m_o t_p-t$, where $m_o$ is a fixed, pre-selected real number greater than 1, and display means for displaying the value of $t_{rem}$.

6. A device as claimed in claim 5, characterized in that $1.2 \leq m_o \leq 6$.

7. A device as claimed in claim 6, characterized in that the type of battery is chosen from the group formed by NiCd, NiMH and Li-ion batteries.

8. A device as claimed in claim 1, characterized in that said means for predicting includes sampling means for measuring V(t) at a plurality of instants of time, means for determining $\Delta V(t)$ for each of said instants of time, where $\Delta V(t)$ is a change in the value of V since the previous measurement, and means for filtering a spurious local minimum value of $\Delta V(t)$.

9. A device as claimed in claim 8, characterized in that said means for filtering includes waiting for a fixed interval of time $\Delta t$ before a next sampling.

10. A device as claimed in claim 9, characterized in that the type of battery is chosen from the group formed by NiCd, NiMH and Li-ion batteries.

* * * * *